United States Patent
Kusaba

(10) Patent No.: US 7,601,227 B2
(45) Date of Patent: Oct. 13, 2009

(54) HIGH PURIFICATION METHOD OF JIG FOR SEMICONDUCTOR HEAT TREATMENT

(75) Inventor: Tatsumi Kusaba, Takeo (JP)

(73) Assignee: Sumco Corporation, Tokyo (JP)

( * ) Notice: Subject to any disclaimer, the term of this patent is extended or adjusted under 35 U.S.C. 154(b) by 196 days.

(21) Appl. No.: 11/197,515

(22) Filed: Aug. 5, 2005

(65) Prior Publication Data

US 2007/0028945 A1    Feb. 8, 2007

(51) Int. Cl.
*B08B 7/04* (2006.01)

(52) U.S. Cl. .................. 134/19; 134/2; 134/3; 134/21; 134/26; 134/28; 134/34; 134/36; 134/41; 134/42

(58) Field of Classification Search ............ 134/2, 134/3, 19, 21, 26, 28, 34, 36, 41, 42
See application file for complete search history.

(56) References Cited

U.S. PATENT DOCUMENTS

| | | | | |
|---|---|---|---|---|
| 3,398,033 | A * | 8/1968 | Haga et al. | 438/734 |
| 5,294,262 | A * | 3/1994 | Nishimura | 134/22.1 |
| 5,494,524 | A * | 2/1996 | Inaba et al. | 118/728 |
| 5,759,426 | A * | 6/1998 | Kobayashi et al. | 216/79 |
| 6,093,644 | A * | 7/2000 | Inaba et al. | 438/680 |
| 6,787,806 | B1 * | 9/2004 | Yamazaki et al. | 257/64 |
| 2004/0023510 | A1 * | 2/2004 | Inaki et al. | 438/723 |
| 2004/0259717 | A1 * | 12/2004 | Odaka | 501/87 |
| 2005/0098877 | A1 * | 5/2005 | Adachi et al. | 257/706 |
| 2006/0024969 | A1 * | 2/2006 | Shive et al. | 438/706 |

FOREIGN PATENT DOCUMENTS

| | | | | |
|---|---|---|---|---|
| JP | 11-016993 | | * | 1/1999 |
| JP | 411016993 | A | * | 1/1999 |
| JP | 2000-119079 | | | 4/2000 |
| JP | 2003277933 | A | * | 10/2003 |
| JP | 2005-197534 | | | 7/2005 |
| WO | WO2006022875 | | * | 3/2006 |

OTHER PUBLICATIONS

Translation of JP-11016993.*
Japanese Office Action. dated Apr. 24 2009. For Appln. No. 2004-032602.

* cited by examiner

*Primary Examiner*—Sharidan Carrillo
(74) *Attorney, Agent, or Firm*—Pillsbury Winthrop Shaw Pittman, LLP

(57) ABSTRACT

A method for achieving high purity in a jig for semiconductor heat treatment includes subjecting a semiconductor heat treatment jig made of a substrate having a surface covered with a silicon carbide film grown by chemical vapor deposition or a semiconductor heat treatment jig made of a silicon carbide film grown by chemical vapor deposition to high-temperature oxidation heat treatment so as to form an oxide film on a surface of the silicon carbide film, and removing the oxide film.

2 Claims, 2 Drawing Sheets

HIGH PURIFICATION METHOD OF JIG FOR SEMICONDUCTOR HEAT TREATMENT

CROSS REFERENCE TO RELATED APPLICATIONS

This application is related to, but does not claim priority from, Japanese Patent Application No. 2004-032602, filed on Feb. 9, 2004, the contents of which are incorporated herein in their entirety by reference.

BACKGROUND OF THE INVENTION

1. Field of the Invention

The present invention relates to a high purification method of jig for semiconductor heat treatment. More specifically, it relates to a method of preventing contamination by heat treatment jigs during the heat treatment of semiconductor wafers such as silicon single-crystal wafers.

2. Description of Related Art

Semiconductor device fabrication process includes a number of heat treatment processes, such as oxidation, diffusion and film growth. Hence, a semiconductor wafer incurs various heat treatment in these processes. A variety of jigs are used in semiconductor heat treatment, depending on such factors such as the mode of heat treatment and the type of heating means employed.

For example, in a semiconductor wafer heat treatment process carried out using a vertical heat treatment furnace, a plurality of semiconductor wafers such as silicon single-crystal wafers are loaded and held in a vertical, multi-step wafer holder known as a vertical wafer boat. Such vertical wafer boats are generally made of a material such as quartz glass, single-crystal silicon, polycrystalline silicon, or silicon-impregnated silicon carbide. Recently, to achieve a high level of purity in heat treatment jigs, use has come to be made of heat treatment jigs obtained by employing a chemical vapor deposition (CVD) process (vapor phase growth process) to cover the surface of heat treatment jigs made of the foregoing materials, as the substrate with a silicon carbide (SiC) film, or of heat treatment jigs composed entirely of silicon carbide films grown by chemical vapor deposition as the substrate.

Even in the case of a thin-film vapor-phase growth process onto a wafer surface using an epitaxial growth reactor or the like, a susceptor composed of a graphite substrate that has been SiC coated on the surface by chemical vapor deposition is used as a susceptor for loading the semiconductor wafer, thereby achieving a high level of purity.

Even in heat treatment jigs covered with a SiC film by chemical vapor deposition, it has recently been reported that if the substrate contains a large amount of impurities, during growth of the CVD-SIC film on the surface of the substrate, impurities within the substrate diffuse in a high concentration to the surface of the SiC film, where they remain present. When heat treatment is carried out using such a jig, contamination of the semiconductor wafers occurs (see, for example, Patent Document 1).

Patent Document 1: Japanese Unexamined Patent Application, First Publication No. 2000-119079

Patent Document 1 thus discloses a process for manufacturing Si—SiC components for use in semiconductor heat treatment, which process includes a mixing step in which SiC powder containing metal impurities in amounts of not more than 0.05 ppm of iron and not more than 0.05 ppm of nickel, copper, sodium, calcium, chromium and potassium combined is mixed with a binder (or a forming aid), a forming step in which these mixed starting materials are shaped into a green body, a calcination step in which the green body is calcined, a purification step in which the calcined body is purified, an impregnation step in which silicon is impregnated into the purified body, and a processing step in which specific portions on the resulting silicon-impregnated component is rendered to a surface roughness (Ra) of not more than 0.20 μm. Here, "specific portions" refers to places where, when a semiconductor is loaded onto the silicon-impregnated component, the component comes into contact with the semiconductor. This process in Patent Document 1 can provide high-purity jigs for heat treatment which are free of impurity contamination even when not coated with a SiC film or in which, even when coated with a SiC film, impurities do not diffuse into the SiC film.

However, achieving a high level of purity in a substrate material such as this requires processes of a considerable complexity, which invites an increase in production costs and is thus impractical. Moreover, there is a limit to the level of purity that can be increased. For example, even if a high-purity substrate is used and a SiC film is grown on the surface thereof, the SiC film is often contaminated by impurities in the course of SiC film growth.

SUMMARY OF THE INVENTION

On studying the impurity concentration profiles in SiC films grown on substrate surfaces by chemical vapor deposition, we have found that the impurity concentration is high at the surface-most portion of the SiC film and is low to the interior thereof (portions of the film closer the substrate). Moreover, on studying the impurity concentration profiles in SiC heat treatment jigs made entirely of chemical vapor-deposited SiC film, we have found that the impurity concentration is high only at the surface-most portion. One would not expect such results to arise if contamination of the SiC film by impurities were caused only by the diffusion of impurities from the substrate during growth of the SiC film. Hence, it appears that impurity contamination arises also from sources other than the substrate during SiC film growth by chemical vapor deposition (e.g., the diffusion of impurities from such components as a film-forming chamber and a heat-insulating tube).

Even if it were possible to grow a SiC film free of contamination by impurities, in a heat treatment jig of a type requiring a high degree of planarization of the SiC film surface (e.g., a heat treatment jig for holding SIMOX (Separation by Implanted Oxygen) wafers), following SiC film growth, the surface is sometimes planarized by surface polishing, in which case the surface of the SiC film may be contaminated by impurities during such mechanical treatment. Hence, merely imparting a high degree of purity to a substrate that will be coated with a SiC film cannot by itself fundamentally resolve the problem of impurity contamination.

In light of the above problems, it is therefore an object of the present invention to provide a method for preventing contamination from heat treatment jigs during the heat treatment of semiconductor wafers such as silicon single-crystal wafers.

Accordingly, the invention provides a method for achieving high purity in a jig for semiconductor heat treatment, which method includes subjecting a semiconductor heat treatment jig made of a substrate having a surface covered with a silicon carbide film grown by chemical vapor deposition or a semiconductor heat treatment jig made of a silicon carbide film grown by chemical vapor deposition to high-temperature oxidation heat treatment so as to form an oxide film on a surface of the silicon carbide film, then removing the oxide film.

In the instant method (process), an oxide film is formed on the surface of a semiconductor heat treatment jig by high-temperature oxidation heat treatment. During formation of this oxide film, the impurities present in the surface layer of the silicon carbide film are trapped within the oxide film and the surface layer of the silicon carbide film is etched by oxide film formation. By subsequently removing the impurity-containing oxide film, there can be provided a highly pure jig for semiconductor heat treatment that is minimally contaminated by impurities.

The high-temperature oxidation heat treatment carried out in this invention is typically heat treatment in which at least 0.1 μm of the silicon carbide surface is etched. Specifically, the jig for semiconductor heat treatment is subjected to preferably at least 5 hours of heat treatment within an oxidizing atmosphere and in a temperature range of 1150 to 1350° C.

As noted above, the silicon carbide film grown by chemical vapor deposition has an impurities concentration profile characterized by a high impurities concentration only at the surface-most portion and a low impurities concentration to the inside thereof. Accordingly, use may be made of any type of oxidation heat treatment which is capable of rendering the surface-most portion to a higher purity, provided the oxidation heat treatment etches away at least 0.1 μm of the silicon carbide film surface. The high-temperature oxidation heat treatment carried out in this invention is preferably heat treatment in a 100% oxygen gas atmosphere. At a heat treatment temperature below 1150° C., the oxide film may not readily form. On the other hand, at a temperature above 1350° C., the jig for semiconductor heat treatment may itself soften and deform. At a heat treatment time of less than 5 hours, the amount of oxide film formation may not be sufficient to enable at least 0.1 μm of the silicon carbide film surface to be etched away and thus achieve an adequate reduction in the level of impurities. Extending the heat treatment time is effective for producing an impurity contamination-lowering effect, but leads to higher production costs due to a longer cycle time and greater wear and deterioration of the equipment and also increases the etching depth of the silicon carbide film. Hence, it is advantageous for the length of heat treatment to be held to not more than 250 hours.

In the practice of the invention, the oxide film that has been formed on the silicon carbide film surface by high-temperature oxidation heat treatment is removed by cleaning treatment. This cleaning treatment may be carried out using any cleaning solution so long as such treatment is able to remove the oxide film. However, it is especially advantageous to use a hydrofluoric acid (an aqueous solution of hydrogen fluoride), which can very efficiently remove the oxide film.

The present invention makes it possible, when carrying out heat treatment using a semiconductor heat treatment jig made of a substrate having a surface covered with a silicon carbide film grown by chemical vapor deposition or a semiconductor heat treatment jig made entirely of a silicon carbide film grown by chemical vapor deposition, to suppress the contamination of the wafers by impurities from the heat treatment jig, and in particular to suppress iron contamination at the wafer surfaces. For example, even when silicon wafers are high-temperature heat-treated in a hydrogen or argon gas atmosphere, by using a vertical heat treatment boat (semiconductor heat treatment jig) that has been rendered to a high level of purity in accordance with the invention, there can be obtained high-quality silicon wafers having an average iron concentration at the silicon wafer surface of not more than $1 \times 10^{10}$ atoms/cm$^3$, enabling the device characteristics to be dramatically improved.

BRIEF DESCRIPTION OF THE DIAGRAMS

DETAILED DESCRIPTION OF THE INVENTION

An embodiment of the inventive method for achieving high purity in a jig for semiconductor heat treatment is described below. The embodiment is a method for increasing the purity of a vertical heat treatment boat, which is a typical example of a semiconductor heat treatment jig (a semiconductor heat treatment tool).

Figure 2:
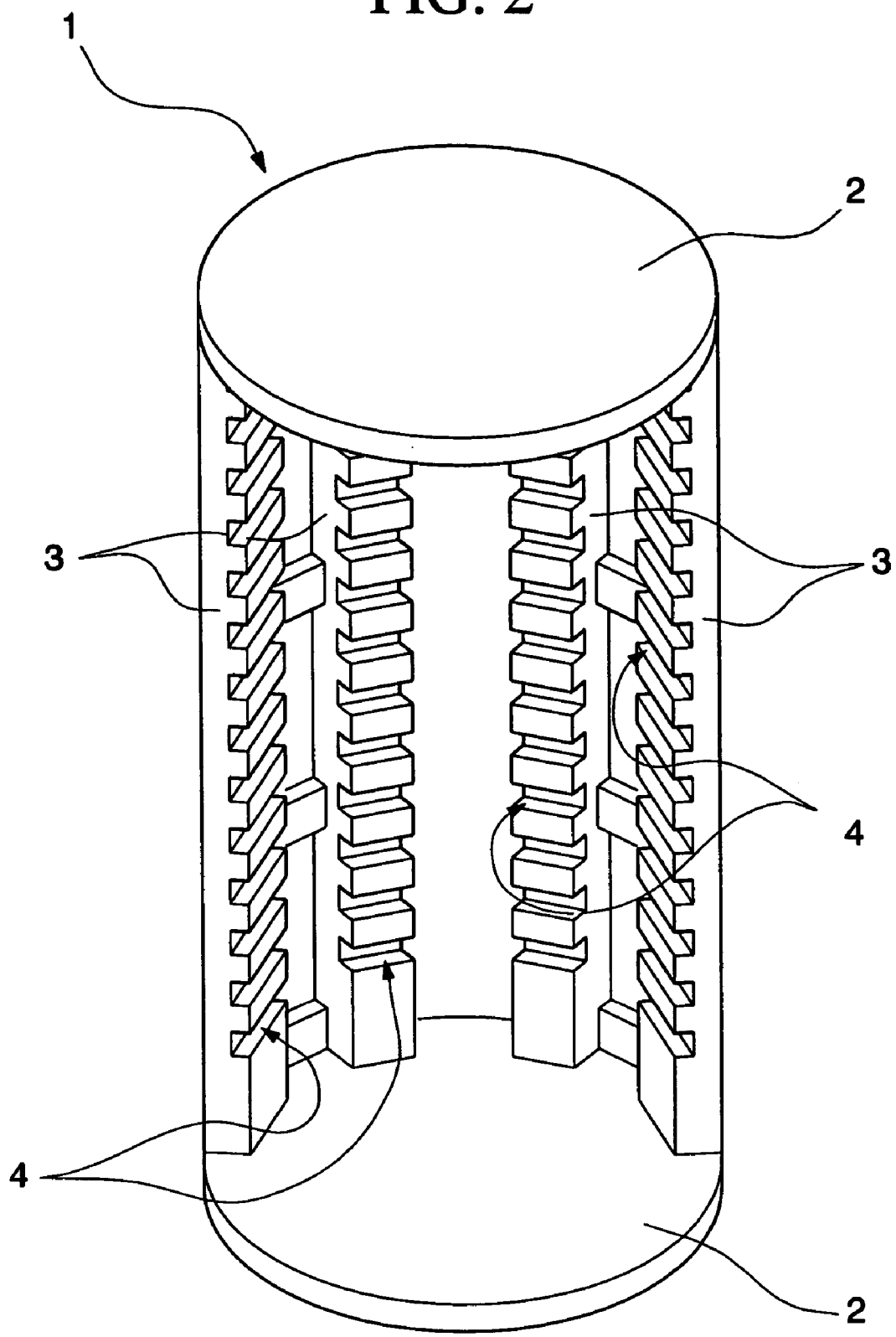
FIG. 2 is a perspective view of a vertical heat treatment boat for semiconductor heat treatment according to the present invention.

A vertical heat treatment boat like that shown in FIG. 2 is generally used in a process for the high-temperature heat treatment of silicon wafers in a hydrogen or argon gas atmosphere. The vertical heat treatment boat 1 is composed of a plurality of wafer support members 3 which are vertically arranged at the periphery of the wafers and each of which has formed therein at given intervals in the lengthwise direction a plurality of wafer insertion slots 4, and a top and bottom pair of frame members 2 which secure both top and bottom ends of the wafer support members 3. The wafer support member 3 and the frame members 2 either fit together (in assembly fashion) or are fused together (integral construction). This vertical heat treatment boat is one in which silicon-impregnated silicon carbide is used as the heat treatment boat substrate for reasons having to do with strength and purity, and this substrate is coated on the surface with a SiC film having a thickness of from several tens of microns to about 100 μm.

In the invention, the vertical heat treatment boat is placed within a heat treatment apparatus, and heat treatment is carried out for at least 5 hours within an oxidizing gas atmosphere and in a temperature range of 1150 to 1350° C. An oxide film is formed in this way on the SiC film surface. In the course of this oxide film forming process, impurities present in the surface layer of the SiC film are trapped within the oxide film and the SiC film surface layer is etched by oxide film formation.

Next, the vertical heat treatment boat is removed from the heat treatment apparatus and is subjected to cleaning treatment by immersion in a hydrofluoric acid (an aqueous solution of hydrogen fluoride). This removes the impurity-containing oxide layer, giving a high-purity vertical heat treatment boat having a minimal level of impurity contamination.

As the number of times the vertical heat treatment boat is used for heat treating semiconductor wafers increases, it incurs contamination from the heat treatment apparatus (heat treatment furnace), increasing the concentration of impurities at the surface. However, a sufficient impurity reducing effect can be achieved even when the inventive method for achieving high purity is administered to a spent vertical heat treatment boat that has been used in such heat treatment.

An embodiment of the invention has been described in which the jig for semiconductor heat treatment is a vertical heat treatment boat used for the high-temperature heat treatment of silicon wafers. However, the invention is not limited whatsoever to this embodiment. For example, the inventive method is effective on all SiC film-coated structural furnace inner components disposed within the heat treatment apparatus, including furnace tubes and heat-insulating tubes, and is effective also on susceptors made of a carbon substrate surface-coated with a SiC film that are disposed within epitaxial growth reactors and on heat treatment boats made entirely of SiC films that are disposed within heat treatment apparatuses during the production of silicon-on-insulator (SOI) wafers.

EXAMPLES

The method for achieving a high purity in jigs for semiconductor heat treatment according to the invention is illustrated in the following examples.

First, the following experiment was carried out to check the impurity reducing effects in the SiC film by the inventive method for achieving a high purity.

In a prior art example, a sample test piece composed of silicon-impregnated silicon carbide substrate (thickness, 5 mm; width, 5 mm; length, 50 mm) coated on the surface by chemical vapor deposition with a SiC film having a film thickness of about 30 μm was prepared. This test piece was cleaned with an aqueous solution of hydrogen fluoride (a simple cleaning to eliminate contamination from handling and the like), following which the iron concentration profile in the SiC film was examined by secondary ion mass spectroscopy (SIMS).

In an example according to the invention, a sample test piece like that in the above prior art example was prepared, after which it was cleaned with an aqueous solution of hydrogen fluoride (a simple cleaning to eliminate contamination from handling and the like), then subjected to 80 hours of high-temperature oxidation heat treatment in a 100% oxygen gas atmosphere at a temperature of 1200° C., thereby forming an oxide film on the surface of the SiC film. The test piece was then immersed in and cleaned with an aqueous solution of hydrogen fluoride, thereby removing the oxide film that had formed on the surface of the test piece. The surface of this test piece in the example according to the invention that was treated to achieve a high purity was examined by secondary ion mass spectroscopy (SIMS) to determine the iron concentration profile within the SiC film.

Figure 1:
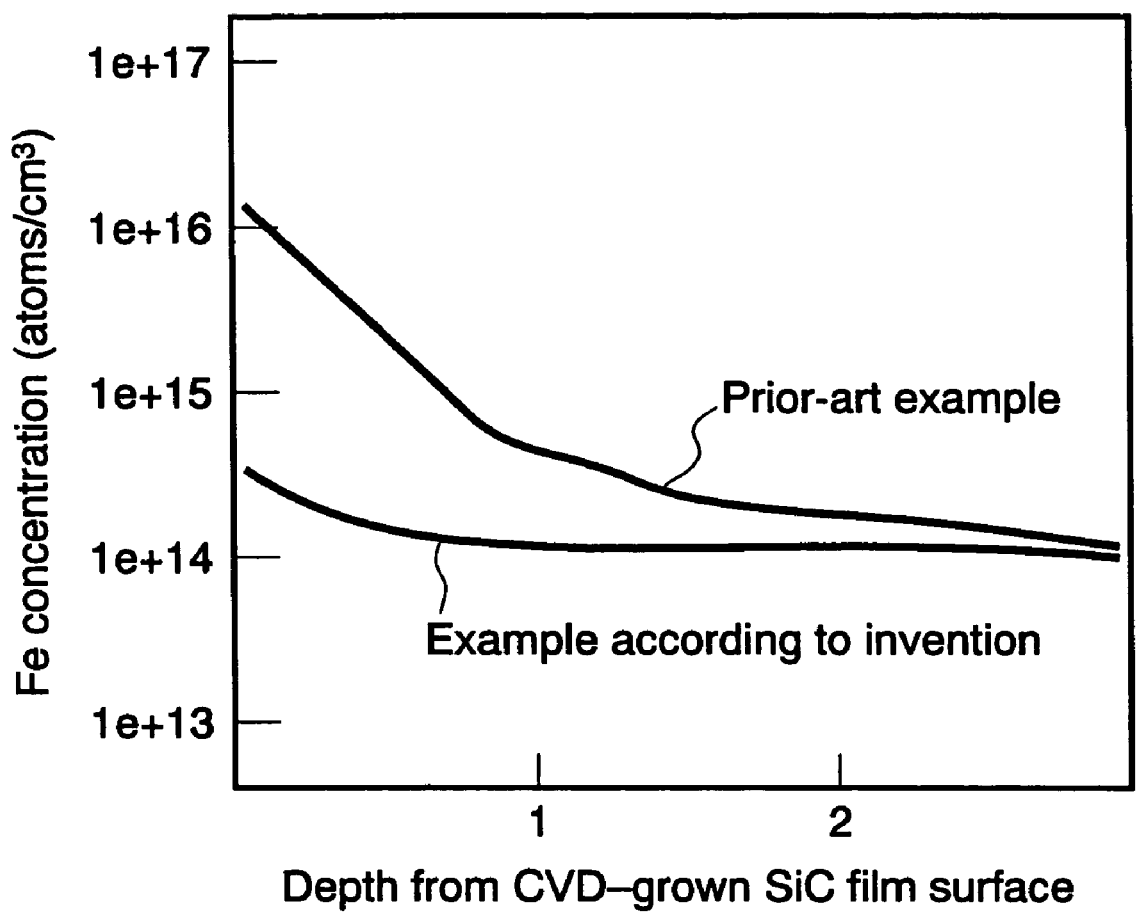
FIG. 1 is a graph showing the iron concentration profile within vertical heat treatment boat SiC films in a prior art example and in an example according to the present invention.

FIG. 1 shows the results obtained in the prior art example and the example according to the invention. As is apparent from FIG. 1, the surface layer of the SiC film in the prior art example had a high iron concentration, whereas the surface layer of the SiC film in the example according to the invention had a very low iron concentration. The weight of the test pieces in the example according to the invention and the prior art example were measured and the etching depth of the SiC film in the test piece for the example according to the invention was computed, based on which it was found that about 1.5 μm was etched relative to the SiC film thickness on the vertical heat treatment boat in the prior art example.

Next, silicon wafers were loaded onto actual vertical heat treatment boats and a specific heat treatment was carried out, then the iron concentrations detected at the surfaces of the silicon wafers following heat treatment were measured. The heat treatment conditions and the results obtained are explained below.

The vertical heat treatment boat in the prior art example was prepared by growing a silicon carbide film on the surface of silicon-impregnated silicon carbide as the boat substrate.

The vertical heat treatment boat in the example according to the invention was prepared by using the same heat treatment boat as in the prior art example, administering high-temperature heat treatment for 80 hours in a 100% oxygen gas atmosphere at a temperature of 1200° C. so as to form an oxide film on the SiC film surface, then immersing and cleaning the resulting boat in an aqueous solution of hydrogen fluoride so as to remove the oxide film that had formed on the heat-treated boat surface.

The silicon wafers used in the prior art example and the example according to the invention were all 200 mm diameter, boron-doped p-type silicon wafers with a (100) crystal plane orientation that had been cut from a single-crystal silicon ingot grown by the Czochralski (CZ) method and mirror polished.

Heat treatment conditions in the prior art example and the example according to the invention were as follows: the above-described silicon wafers were loaded into the vertical heat treatment boat, then placed in a heat treatment furnace and heat-treated for 1 hour in an argon atmosphere at a temperature of 1200° C.

Each of the silicon wafers heat-treated in the vertical heat-treatment boats in the prior art example and the example according to the invention was then subjected to measurement of the in-plane average iron concentration at the wafer surface using surface photo voltage (SPV) spectroscopy.

In the silicon wafers that were heat treated using the prior-art vertical heat treatment boat, regardless of the loading position within the vertical heat treatment boat, the level of contamination at the surface was found to be an average iron concentration of $5 \times 10^{12}$ atoms/cm$^3$. By contrast, all of the silicon wafers that were heat-treated using the vertical heat treatment boat according to the present invention had an average iron concentration at the surface of less than $5 \times 10^{10}$ atoms/cm$^3$.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

INDUSTRIAL APPLICABILITY

Semiconductor heat treatment jigs treated by the inventive method for achieving a high purity have very low levels of metal contamination. In various heat treatment processes such as oxidation, diffusion and film growth, contamination by impurities from such heat treatment jigs (tools) to the wafers, particularly iron contamination at the surfaces of the wafers, can thus be minimized, enabling wafers that are free of defects in device characteristics to be obtained.

The invention claimed is:

1. A method for removing impurities from a semiconductor heat treatment jig used for heat treatment of a semiconductor wafer, comprising:

heat treating a semiconductor wafer using a semiconductor heat treatment jig having a silicon carbide film and impurities present on a surface of said silicon carbide film;

after heat treating of said semiconductor wafer, subjecting the semiconductor heat treatment jig to a high-temperature oxidation heat treatment for 80 to 250 hours in an oxidizing atmosphere and at a temperature in the range of 1150 to 1350° C., so as to form an oxide film on the surface of the silicon carbide film, wherein the high-temperature oxidation heat treatment etches at least 0.1 μm of the surface of the silicon carbide film by forming the oxide film; and removing impurities from the surface of the silicon carbide film of said semiconductor heat treatment jig by removing the oxide film, wherein the semiconductor heat treatment jig is made of a substrate having a surface covered with the silicon carbide film grown by chemical vapor deposition or made of the silicon carbide film grown by chemical vapor deposition.

2. A method for removing impurities from a semiconductor heat treatment jig used for heat treatment of a semiconductor wafer according to claim 1, wherein the oxide film is removed by a cleaning treatment.

* * * * *